(12) United States Patent
Li et al.

(10) Patent No.: US 10,008,687 B2
(45) Date of Patent: Jun. 26, 2018

(54) OLED DISPLAY APPARATUS AND PREPARATION METHOD THEREOF

(71) Applicants: BOE Technology Group Co., Ltd., Beijing (CN); Hefei BOE Optoelectronics Technology Co., Ltd., Anhui (CN)

(72) Inventors: Yajun Li, Beijing (CN); Yang-Sik Youn, Beijing (CN); Zhihai Zhang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days. days.

(21) Appl. No.: 15/522,869

(22) PCT Filed: May 11, 2016

(86) PCT No.: PCT/CN2016/081680
§ 371 (c)(1),
(2) Date: Apr. 28, 2017

(87) PCT Pub. No.: WO2017/140045
PCT Pub. Date: Aug. 24, 2017

(65) Prior Publication Data
US 2018/0062108 A1 Mar. 1, 2018

(30) Foreign Application Priority Data
Feb. 15, 2016 (CN) .......................... 2016 1 0086268

(51) Int. Cl.
*H01L 51/00* (2006.01)
*H01L 51/52* (2006.01)
(Continued)

(52) U.S. Cl.
CPC .......... *H01L 51/5237* (2013.01); *H01L 27/32* (2013.01); *H01L 51/0036* (2013.01);
(Continued)

(58) Field of Classification Search
CPC ........... H01L 2924/12044; H01L 51/52; H01L 51/50; H01L 2227/32
See application file for complete search history.

(56) References Cited

U.S. PATENT DOCUMENTS

| 7,368,869 B2 | 5/2008 | Chung et al. |
| 2006/0091778 A1 * | 5/2006 | Setlur ................ C09K 11/7734 313/486 |

(Continued)

FOREIGN PATENT DOCUMENTS

| CN | 101116196 A | 1/2008 |
| CN | 101789441 A | 7/2010 |

(Continued)

OTHER PUBLICATIONS

International Search Report and Written Opinion, including English translation of Box No. V of the Written Opinion, for International Application No. PCT/CN2016/081680, dated Nov. 25, 2016, 14 pages.

(Continued)

*Primary Examiner* — Ngan Ngo
(74) *Attorney, Agent, or Firm* — Westman, Champlin & Koehler, P.A.

(57) ABSTRACT

This disclosure relates to an OLED display apparatus and the preparation method thereof. The OLED display apparatus comprises, from the bottom to the top, a substrate, an OLED device, a thin film inner layer, an ethylcellulose layer, and a thin film outer layer. By adding a hydrophobic ethylcellulose layer with a photosensitive material and a singlet oxygen receptor dissolved therein on the basis of current thin film packaging, this invention can have the functions of water vapor barrier and oxygen absorption so as to improve the service life of devices.

14 Claims, 2 Drawing Sheets

(51) Int. Cl.
*H01L 27/32* (2006.01)
*H01L 51/50* (2006.01)
*H01L 51/56* (2006.01)

(52) U.S. Cl.
CPC .......... *H01L 51/50* (2013.01); *H01L 51/5056* (2013.01); *H01L 51/5072* (2013.01); *H01L 51/52* (2013.01); *H01L 51/5259* (2013.01); *H01L 51/56* (2013.01); *H01L 2227/32* (2013.01); *H01L 2924/12044* (2013.01)

(56) References Cited

U.S. PATENT DOCUMENTS

| | | |
|---|---|---|
| 2009/0114905 A1 | 5/2009 | Ottermann et al. |
| 2010/0294024 A1 | 11/2010 | Kumar et al. |
| 2013/0228754 A1* | 9/2013 | Park .................. H01L 27/15 257/40 |
| 2014/0057379 A1* | 2/2014 | Park .................. B41M 5/46 438/46 |
| 2016/0064696 A1* | 3/2016 | Collier ............... H01L 21/477 428/161 |
| 2017/0077446 A1 | 3/2017 | Li |

FOREIGN PATENT DOCUMENTS

| | | |
|---|---|---|
| CN | 105097881 A | 11/2015 |
| CN | 105118931 A | 12/2015 |
| JP | H05-190282 A | 7/1993 |
| WO | 2008/043848 A2 | 4/2008 |

OTHER PUBLICATIONS

Design Handbook for Grease Factory, Dongping HE ed., Chap. 25, p. 4282, Aug. 1, 2012, 2 pages.
First Office Action, including Search Report, for Chinese Patent Application No. 201610086268.0, dated Mar. 5, 2018, 14 pages.

* cited by examiner

OLED DISPLAY APPARATUS AND PREPARATION METHOD THEREOF

CROSS-REFERENCE TO RELATED APPLICATION

This Application is a Section 371 National Stage Application of International Application No. PCT/CN2016/081680, filed 11 May 2016, which has not yet published, which claims priority to Chinese Patent Application No. 201610086268.0, filed on 15 Feb. 2016, the contents of which are hereby incorporated by reference in their entirety.

TECHNICAL FIELD

This disclosure relates to an OLED display apparatus and the preparation method thereof, and belongs to the technical field of OLED packaging.

BACKGROUND ART

It has been demonstrated by investigations that components such as water vapor and oxygen in the air has great influence on the service life of OLEDs. This is mainly because metals used as cathodes, such as aluminum, magnesium, calcium, etc., are relatively active and will easily react with permeated water vapor. Furthermore, water vapor will be also subjected to chemical reaction with a hole transport layer and an electron transport layer (ETL) to cause device failure. Therefore, the service life of a device may be greatly elongated, as long as an OLED is subjected to effective packaging to separate respective functional layers of a device from components such as water vapor, oxygen, and the like in the atmosphere. However, the previously reported thin film packaging includes various processes, such as inorganic film packaging, organic film packaging, inorganic-organic film combined packaging, etc., and none of them can achieve 100% barrier of water vapor and oxygen.

Therefore, how to provide an OLED packaging method, which can effectively have the functions of water vapor barrier and oxygen absorption, appears to be extremely important.

SUMMARY OF THE INVENTION

An object of this disclosure is to provide an OLED display apparatus and the preparation method thereof. By adding a hydrophobic ethylcellulose layer with an organic photosensitive material and a singlet oxygen receptor material dissolved therein on the basis of thin film packaging, it is possible to provide the functions of water vapor barrier and oxygen absorption effectively, so as to improve the service life of devices.

In order to achieve the object described above, an aspect of this invention provides a technical solution as follows.

An OLED display apparatus comprises, from the bottom to the top, a substrate, an OLED device, a thin film inner layer, an ethylcellulose layer, and a thin film outer layer.

In a preferred embodiment of this invention, the ethylcellulose layer may comprise an organic photosensitive material, a singlet oxygen acceptor material, and ethylcellulose.

In another preferred embodiment of this invention, the molar ratio of the organic photosensitive material, the singlet oxygen acceptor material, and the ethylcellulose may be 1-3:1-3:2-4; and preferably the ratio is 2:2:3.

It has been found in investigations that the composition and the proportioning of the ethylcellulose layer have relatively great influence on packaging of an OLED display apparatus. Water vapor barrier should be ensured, and oxygen absorption should also be ensured. More precise requirements for the composition and the specific usage amount ratio of the materials of the ethylcellulose layer are proposed. It has been confirmed by a large number of experiments that when the composition described above is being produced at a specific ratio, the ethylcellulose layer obtained can well achieve the functions of water vapor barrier and oxygen absorption, which is more favorable to the improvement of service life of devices.

In another preferred embodiment of this invention, the ethylcellulose layer may further contain alkenyl succinic anhydride (ASA). In still another preferred embodiment of this invention, the molar ratio of alkenyl succinic anhydride to ethylcellulose is 1:2 to 3.

In another preferred embodiment of this invention, the organic photosensitive material may be one or more selected from a complex composed of an organic molecule with an extended conjugated $\pi$ bond and a metal (such as metalloporphyrin and metal phthalocyanine), rose bengal, lucifer yellow, acridine red, and methylene blue.

In another preferred embodiment of this invention, the singlet oxygen acceptor material may be one or more selected from: substances which may react with monoalkene, substances which may be subjected to a Diels-AlDer type reaction with a chain-like, cyclic, aromatic, or heterocyclic aromatic conjugated $\pi$ bond, substances which may react with an active double bond having an electron-donating heteroatom such as N, O, S, etc., or substances which may react with carotenoids, amines, phenols, sulfides, or heterocyclic compounds. Preferably, the singlet oxygen acceptor material may be selected from β-carotenes.

In another preferred embodiment of this invention, the thin film inner layer may be prepared from a parylene thin film; and the thin film outer layer may be prepared from a parylene thin film.

In another preferred embodiment of this invention, the ethylcellulose layer may have a thickness of 500 to 1000 μm.

Another aspect of this invention further provides a preparation method of an OLED display apparatus, and the method comprises the steps of:

1) producing an OLED device on a substrate, forming a thin film inner layer for the OLED device, and packaging;

2) forming an ethylcellulose layer on the surface of the thin film inner layer, and packaging; and 3) forming a thin film outer layer on the surface of the ethylcellulose layer, and packaging.

In another preferred embodiment of this invention, the ethylcellulose layer may comprise an organic photosensitive material, a singlet oxygen acceptor material, and ethylcellulose. and the ethylcellulose layer may be prepared by the following method:

coating and drying a solution of an organic photosensitive material, a singlet oxygen acceptor material, and ethylcellulose in a solvent on the thin film inner layer.

In another preferred embodiment of this invention, the molar ratio of the organic photosensitive material, the singlet oxygen acceptor material, and the ethylcellulose may be 1-3:1-3:2-4.

In another preferred embodiment of this invention, the ethylcellulose layer may have a thickness of 500 to 1000 μm.

Particularly, the ethylcellulose layer may be prepared by the following method:

(1) placing ethylcellulose (EC) in a solvent and stirring it to allow it to be dissolved, further adding an organic photosensitive material and a singlet oxygen acceptor material, and uniformly mixing them and keeping them standing until bubbles disappear; and (2) uniformly coating the mixed liquid obtained in the above step on a thin film inner layer, naturally drying it, and drying it with an oven to form an ethylcellulose layer.

Here, in step (1), the solvent is trichloromethane.

Here, in step (1), alkenyl succinic anhydride may be further added.

Here, in step (2), the mixed liquid is coated on the thin film inner layer, and is transferred to a vacuum oven for drying at 80° C. after naturally drying for 24 hours, to form an ethylcellulose layer.

In another preferred embodiment of this invention, the molar ratio of alkenyl succinic anhydride to ethylcellulose may be 1:2 to 3.

In an embodiment of this invention, a hydrophobic ethylcellulose layer with an organic photosensitive material and a singlet oxygen receptor material dissolved therein is added, on the basis of existing thin film packaging. When oxygen is transmitted through an organic thin film, photosensitive dye molecules excited by light irradiation will sensitize permeated oxygen molecules into singlet oxygen. These singlet oxygen molecules will be consumed by reacting with receptor molecules, and thus there will be no oxygen transmitted through the packaging thin film. Therefore, the functions of water vapor barrier and oxygen absorption can be achieved to improve the service life of devices.

Figure 1:
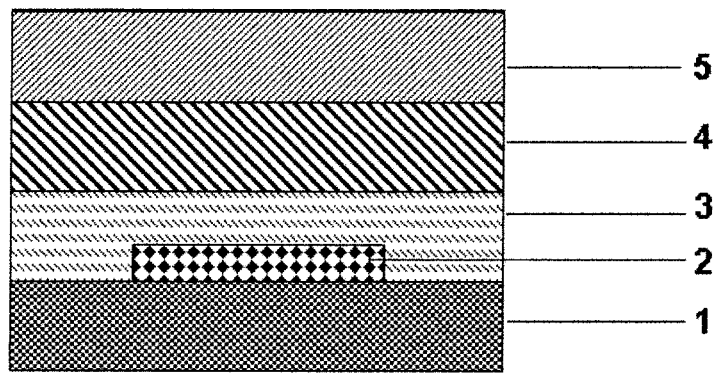
FIG. 1 is a structural schematic diagram of the OLED display apparatus of Example 1 of this invention.

In the figures, 1. substrate; 2. OLED device; 3. thin film inner layer; 4. ethylcellulose layer; 5. thin film outer layer.

DESCRIPTION OF EMBODIMENTS

An aspect of this invention provides an OLED display apparatus sequentially comprises, from the bottom to the top, for example, a substrate, an OLED device, a thin film inner layer, an ethylcellulose layer, and a thin film outer layer. By adding a hydrophobic ethylcellulose layer containing an organic photosensitive material and a singlet oxygen receptor on a thin film inner layer, the OLED display apparatus is allowed to have effects of water vapor barrier and oxygen absorption so as to improve the service life of devices.

The OLED display apparatus of this invention may be a top-emission type OLED display apparatus, or may be a bottom-emission type OLED display apparatus.

The "top" and the "bottom" in the term "from the bottom to the top" herein are only used to represent the relative positional relationship of related devices of the OLED display apparatus, rather than the "top" and the "bottom" in the nature. For example, the thin film outer layer may be located on the upper surface, the lower surface, and the like of the OLED display apparatus. These devices may also be placed from the left to the right, so that the thin film outer layer may be located on the left surface, the right surface, and the like of the OLED display apparatus. Therefore, "from the bottom to the top" can be replaced by "from the top to the bottom", "from the left to the right", "from the right to the left", "from the front to the rear", or "from the rear to the front".

The ethylcellulose is a nonionic cellulose ether, which is insoluble in water but soluble in an organic solvent, and has the following structure:

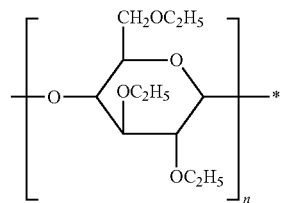

wherein n represents polymerization degree.

The ethylcellulose has the characteristic of good thermal stability. Upon combustion, it has extremely low ash content, and a tough thin film can be generated; and at a low temperature, it can still maintain the flexibility and is non-toxic, and has antibiotic performance and metabolic inertia. The ethylcellulose has the following specific characteristics:

1. Non-flammable.
2. Good thermal stability and good thermoplasticity.
3. Non-discoloring under sunlight.
4. Good flexibility.
5. Good dielectricity.
6. Good alkali resistance and good weak-acid resistance.
7. Good performance for preventing aging.
8. Good resistance to salt, cold, and moisture absorption.
9. Stable for chemicals and not deteriorated upon long-period storage.
10. Able to be compatible with a number of resins and good compatibility with all plasticizers.
11. Prone to be discolored in strongly alkaline environment and conditions of heating.

In this disclosure, an organic photosensitive material and a singlet oxygen acceptor material are added to ethylcellulose, and the prepared ethylcellulose layer can effectively block water vapor and absorb oxygen. The ethylcellulose layer comprises at least an organic photosensitive material, a singlet oxygen acceptor material, and ethylcellulose. Preferably, the organic photosensitive material, the singlet oxygen acceptor material, and the ethylcellulose are mixed and prepared at a molar ratio of 1-3:1-3:2-4, more preferably 2:2:3.

In order to further improve the strength of the ethylcellulose layer and enhance the effect of packaging, an appropriate amount of alkenyl succinic anhydride (ASA) may be further added to ethylcellulose. The molar ratio of alkenyl succinic anhydride to ethylcellulose may be 1:2 to 3.

The organic photosensitive material may be one or more selected from a complex composed of an organic molecule with an extended conjugated π bond and a metal (such as metalloporphyrin and metal phthalocyanine), rose bengal, lucifer yellow, acridine red, and methylene blue.

The singlet oxygen acceptor material is one or more selected from: substances which may react with monoalkene; substances which is subjected to a Diels-AlDer type reaction with a chain-like, cyclic, aromatic, or heterocyclic aromatic conjugated π bond; substances which may react with an active double bond having an electron-donating heteroatom such as N, O, S, etc.; or substances which may react with carotenoids, amines, phenols, sulfides, or heterocyclic compounds. Preferably, the singlet oxygen acceptor material may be selected from β-carotenes.

When the OLED apparatus in one aspect of this invention is working, when oxygen and water vapor permeated through the thin film outer layer encounter the ethylcellulose layer, water vapor is effectively blocked due to the hydrophobicity of the ethylcellulose film. Meanwhile, under the effect of light irradiation, the excited organic photosensitive material will sensitize permeated oxygen molecules into singlet oxygen. These singlet oxygen molecules may react with the singlet oxygen acceptor material and is in turn consumed. Therefore, the effects of water vapor barrier, oxygen absorption, and service life improvement of devices are achieved.

Here, the photosensitization reaction is as follows:

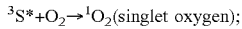

and the singlet oxygen reaction is as follows:

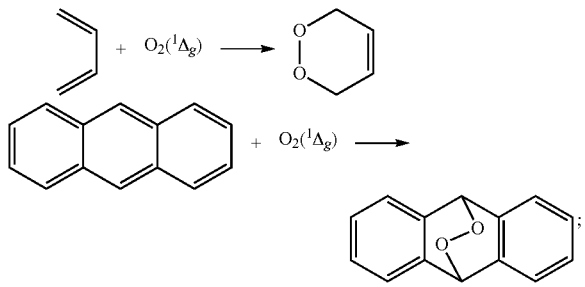

the thin film inner layer may be prepared from a parylene thin film; and the thin film outer layer may be prepared from a parylene thin film.

Another aspect of this invention further provides a preparation method of an OLED display apparatus, comprising the steps of:

1) producing an OLED device on a substrate, forming a thin film inner layer for the OLED device, and packaging;

2) forming an ethylcellulose layer on the surface of the thin film inner layer, and packaging; and 3) forming a thin film outer layer on the surface of the ethylcellulose layer, and packaging.

Preferably, the ethylcellulose layer may be prepared by the following method:

(1) placing ethylcellulose (EC) in a solvent and stirring it to allow it to be dissolved, further adding an organic photosensitive material and a singlet oxygen acceptor material, and uniformly mixing them and keeping them standing until bubbles disappear; and (2) uniformly coating the mixed liquid obtained in the above step on a thin film inner layer, naturally drying it, and drying it with an oven to form an ethylcellulose layer.

Here, in step (1), the solvent may be trichloromethane.

Here, in step (1), alkenyl succinic anhydride may be further added.

Here, in step (2), the mixed liquid is coated on the thin film inner layer, and is transferred to a vacuum oven for drying at 80° C. after naturally drying for 24 hours, to form an ethylcellulose layer.

By adding a hydrophobic ethylcellulose layer with a photosensitive material and a singlet oxygen receptor dissolved therein on the basis of current thin film packaging, this invention can have the functions of water vapor barrier and oxygen absorption so as to improve the service life of devices.

In FIG. 1, the OLED display apparatus comprises, from the bottom to the top, a substrate 1, an OLED device 2, a thin film inner layer 3, an ethylcellulose layer 4, and a thin film outer layer 5.

The OLED device 2 sequentially comprises: an anode, an optional planarizing layer, a hole injection layer, a hole transport layer, an organic light-emitting layer, an electron transport layer, an electron injection layer, and a cathode, along the direction going away from the substrate 1, wherein the above-mentioned anode is usually produced using ITO. Forming the OLED device on the substrate 1 specifically comprises: producing an anode using the processes of magnetron sputtering and etching; producing a planarizing layer on the anode, wherein the above-mentioned planarizing layer may be optionally produced or not; forming a hole injection layer, a hole transport layer, an organic light-emitting layer, an electron transport layer, an electron injection layer, and a cathode layer by using a vacuum deposition process or a painting and printing process; and after the above process is finished, the display device is packaged to form a thin film inner layer, an ethylcellulose layer, and a thin film outer layer on the OLED device.

The examples below are provided to illustrate this invention but are not intended to limit the scope of this invention.

Substances used in Examples were as follows:

Ethylcellulose (EC): analytically pure, Tianjin Kemiou Chemical Reagent Development Center Metallic iron porphyrin: analytically pure, Sinopharm Chemical Reagent Co., Ltd.

β-carotene: analytically pure, Sinopharm Chemical Reagent Co., Ltd.

ASA: analytically pure, Hercules Inc., US.

Comparative Example 1

The OLED display apparatus of Comparative Example 1 comprised, from the bottom to the top, a substrate, an OLED device, a thin film inner layer, and a thin film outer layer.

The OLED display apparatus of Comparative Example 1 was prepared as follows.

An OLED device was produced on a substrate, and packaging of a thin film inner layer was performed on the OLED device; and packaging of a thin film outer layer was performed on the surface of the thin film inner layer. The thin film inner layer was prepared from a parylene thin film; and the thin film outer layer was prepared from a parylene thin film, wherein the thicknesses of the thin film inner layer and the thin film outer layer are 750 μm and 750 μm respectively.

Example 1

The OLED display apparatus of Example 1 was the same as the OLED display apparatus of Comparative Example 1, except that an ethylcellulose layer was added between the thin film inner layer and the thin film outer layer. The OLED display apparatus of Example 1 was prepared as follows:

1) producing an OLED device on a substrate, and performing packaging of a thin film inner layer on the OLED device;

2) producing an ethylcellulose layer on the surface of the thin film inner layer, and packaging; and 3) performing packaging of a thin film outer layer on the surface of the ethylcellulose layer.

The ethylcellulose layer was prepared by the following method.

Ethylcellulose (EC) was placed in trichloromethane and was stirred to allow it to be dissolved. Further, metallic iron porphyrin and β-carotene were added, and were uniformly mixed and kept standing until bubbles disappeared, to obtain a mixed liquid. The resultant mixed liquid was uniformly coated on a thin film inner layer, was naturally dried for 24 hours, and was transferred to a vacuum oven for drying at 80° C., to form an ethylcellulose layer, wherein the thickness was 750 μm.

The molar ratio of metallic iron porphyrin, β-carotene, and ethylcellulose was 2:2:3.

Example 2

The OLED display apparatus of Example 2 was the same as the OLED display apparatus of Example 1, except that the ethylcellulose layer thereof further contained ASA. The preparation method thereof was the same as the preparation method of the OLED display apparatus of Example 1, except that ASA was added while ethylcellulose was added. The formed ethylcellulose layer had a thickness of 750 μm.

the molar ratio of metallic iron porphyrin, β-carotene, ethylcellulose, and ASA was 2:2:3:1.2.

Ca Electrical Test

Figure 2:
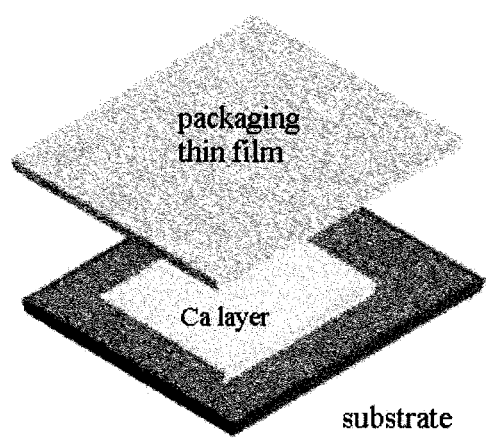
FIG. 2 is a structural diagram of a Ca electrical test system.

A comparison tests was performed with a Ca electrical test system, and the test system had a structure as shown in FIG. 2. The basic principle was that a Ca layer was produced on a substrate, packaging was performed with a thin film, and then a normalized curve of 1/R of the Ca layer varying over time was tested and the appearance of the OLED display apparatus was observed. The specific operation method was as follows.

1) The water-oxygen barrier properties of the OLED display apparatus packaged with an existing organic thin film (Comparative Example 1) and the OELD display apparatus of Example 1 were tested at a high temperature of 200° C. by a Ca electrical test method, respectively. The test was performed for 80 h, and data records were taken every 2 h, which were shown in Table 1.

TABLE 1

| t/h | Normalized Concentration/(1 R) | |
|---|---|---|
| | Comparative Example 1 | Example 1 |
| 2 | 1.000 | 1.000 |
| 4 | 0.999 | 0.999 |
| 6 | 0.998 | 0.999 |
| 8 | 0.990 | 0.998 |
| 10 | 0.985 | 0.998 |
| 12 | 0.982 | 0.997 |
| 14 | 0.980 | 0.997 |
| 16 | 0.976 | 0.996 |
| 18 | 0.975 | 0.996 |
| 20 | 0.973 | 0.995 |
| 22 | 0.970 | 0.994 |
| 24 | 0.965 | 0.994 |
| 26 | 0.963 | 0.993 |
| 28 | 0.960 | 0.989 |
| 30 | 0.955 | 0.987 |
| 32 | 0.951 | 0.985 |

TABLE 1-continued

| t/h | Normalized Concentration/(1 R) | |
|---|---|---|
| | Comparative Example 1 | Example 1 |
| 34 | 0.947 | 0.983 |
| 36 | 0.941 | 0.980 |
| 38 | 0.934 | 0.978 |
| 40 | 0.928 | 0.974 |
| 42 | 0.920 | 0.970 |
| 44 | 0.910 | 0.964 |
| 46 | 0.902 | 0.960 |
| 48 | 0.890 | 0.954 |
| 50 | 0.880 | 0.950 |
| 52 | 0.870 | 0.944 |
| 54 | 0.860 | 0.939 |
| 56 | 0.840 | 0.936 |
| 58 | 0.810 | 0.931 |
| 60 | 0.790 | 0.927 |
| 62 | 0.770 | 0.923 |
| 64 | 0.752 | 0.919 |
| 66 | 0.729 | 0.915 |
| 68 | 0.700 | 0.910 |
| 70 | 0.675 | 0.906 |
| 72 | 0.655 | 0.900 |
| 74 | 0.600 | 0.892 |
| 76 | 0.540 | 0.886 |
| 78 | 0.480 | 0.880 |
| 80 | 0.400 | 0.873 |

It can be known from Table 1 that the water-oxygen barrier property of Comparative Example 1 began to decrease from 10 h, and was significantly different from that of the OELD apparatus of Example 1 of this invention by about 30 h. After 60 h, the water-oxygen barrier property of Comparative Example 1 significantly decreased, while the OELD apparatus of Example 1 of this invention still maintained a good water-oxygen barrier property.

Figure 3:
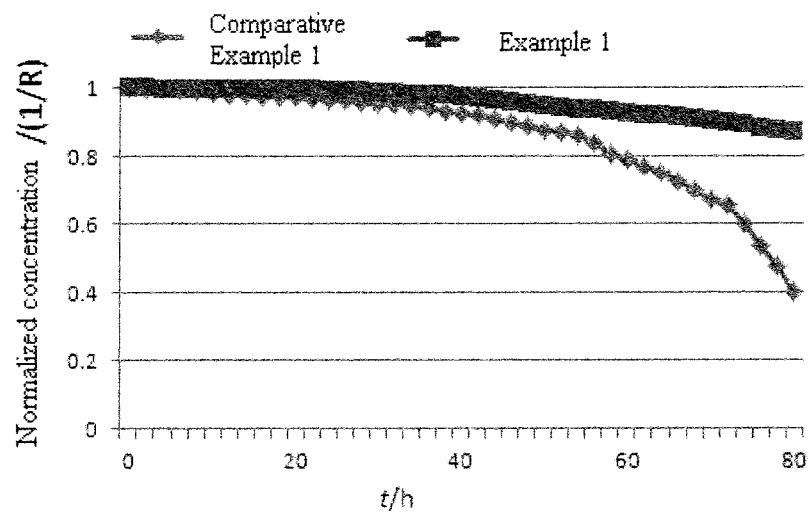
FIG. 3 is a normalized plot of 1/R varying over time for Ca layers of Comparative Example 1 and Example 1 in a Ca electrical test.

2) A normalized concentration plot of 1/R of a Ca layer varying over time was as shown in FIG. 3. According to the principle of the test, when the reaction of Ca with water and oxygen occurred, the conductivity of the portion where the reaction occurred decreased, and the resistance of the thin film increased. The curve in the figure exhibited a reduced conductivity, and thus it can be seen that the barrier effect of water and oxygen of Example 1 was superior to that of Comparative Example 1.

The reaction equation of the Ca layer in the presence water and oxygen was as follows:

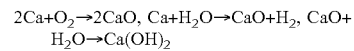

Figure 4:
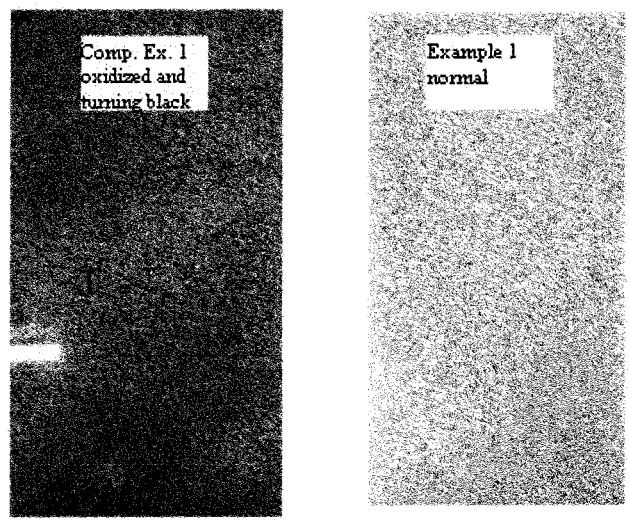
FIG. 4 is main views of Comparative Example 1 and Example 1 after testing in a Ca electrical test.

3) FIG. 4 was main views of the OLED display apparatus of Comparative Example 1 and the display apparatus of Example 1 after the test. It can be known from the figure that the apparatus packaged with an existing organic film was significantly oxidized and turned black, while the OLED apparatus obtained in Example 1 of this invention had normal display.

In addition to good water-oxygen barrier property, which was the same as that of the OELD apparatus of Example 1, the OELD apparatus of Example 2 had a film layer of which the tensile strength was enhanced, because ASA had an effect of plasticization.

Although this invention has been exhaustively described hereinbefore by using general descriptions and specific embodiments, some modifications and improvements may be made thereto based on this invention, which is apparent to the person skilled in the art. Therefore, these modifications or improvements made on the basis of not departing from the spirit of this invention all belong to the scope sought to be protected by this invention.

What is claimed is:

1. An OLED display apparatus, wherein the OLED display apparatus sequentially comprises a substrate, an OLED device, a thin film inner layer, an ethylcellulose layer, and a thin film outer layer, the ethylcellulose layer comprises an organic photosensitive material, a singlet oxygen acceptor material, and ethylcellulose.

2. The OLED display apparatus according to claim 1, wherein a molar ratio of the organic photosensitive material, the singlet oxygen acceptor material, and the ethylcellulose is 1-3:1-3:2-4.

3. The OLED display apparatus according to claim 1, wherein the organic photosensitive material is one or more selected from a complex composed of an organic molecule with an extended conjugated π bond and a metal, rose bengal, lucifer yellow, acridine red, and methylene blue.

4. The OLED display apparatus according to claim 1, wherein the singlet oxygen acceptor material is one or more selected from:
    substances which may react with monoalkene;
    substances which may be subjected to a Diels-AlDer type reaction with a chain-like, cyclic, aromatic, or heterocyclic aromatic conjugated π bond;
    substances which may react with an active double bond having an electron-donating heteroatom, N, O, or S; or
    substances which may react with carotenoids, amines, phenols, sulfides, or heterocyclic compounds.

5. The OLED display apparatus according to claim 1, wherein the thin film inner layer is prepared from a parylene thin film; and the thin film outer layer is prepared from a parylene thin film.

6. The OLED display apparatus according to claim 1, wherein the ethylcellulose layer has a thickness of 500 to 1000 μm.

7. The OLED display apparatus according to claim 1, wherein the ethylcellulose layer further contains alkenyl succinic anhydride.

8. The OLED display apparatus according to claim 7, wherein a molar ratio of alkenyl succinic anhydride to ethylcellulose is 1:2 to 3.

9. A preparation method of an OLED display apparatus, characterized by comprising the steps of:
    producing an OLED device on a substrate, forming a thin film inner layer for the OLED device, and packaging;
    forming an ethylcellulose layer on the surface of the thin film inner layer, and packaging, wherein the ethylcellulose layer comprises an organic photosensitive material, a singlet oxygen acceptor material, and ethylcellulose; and
    forming a thin film outer layer on the surface of the ethylcellulose layer, and packaging.

10. The preparation method according to claim 9, wherein the ethylcellulose layer is prepared by the following method:
    coating and drying a solution of an organic photosensitive material, a singlet oxygen acceptor material, and ethylcellulose in a solvent on the thin film inner layer.

11. The preparation method according to claim 9, wherein the solvent is trichloromethane.

12. The preparation method according to claim 9, wherein a molar ratio of the organic photosensitive material, the singlet oxygen acceptor material, and the ethylcellulose is 1-3:1-3:2-4.

13. The preparation method according to claim 9, wherein the ethylcellulose layer has a thickness of 500 to 1000 μm.

14. The preparation method according to claim 9, wherein the ethylcellulose layer further contains alkenyl succinic anhydride, and a molar ratio of alkenyl succinic anhydride to ethylcellulose is 1:2 to 3.

* * * * *